United States Patent
McCollum et al.

(10) Patent No.: US 7,482,218 B1
(45) Date of Patent: Jan. 27, 2009

(54) LOW-CAPACITANCE INPUT/OUTPUT AND ELECTROSTATIC DISCHARGE CIRCUIT FOR PROTECTING AN INTEGRATED CIRCUIT FROM ELECTROSTATIC DISCHARGE

(75) Inventors: John McCollum, Saratoga, CA (US); Fethi Dhaoui, Patterson, CA (US)

(73) Assignee: Actel Corporation, Mountain View, CA (US)

( * ) Notice: Subject to any disclaimer, the term of this patent is extended or adjusted under 35 U.S.C. 154(b) by 70 days.

(21) Appl. No.: 11/677,441

(22) Filed: Feb. 21, 2007

Related U.S. Application Data

(62) Division of application No. 11/282,826, filed on Nov. 18, 2005, now abandoned, which is a division of application No. 10/619,172, filed on Jul. 11, 2003, now Pat. No. 7,019,368.

(51) Int. Cl.
*H01L 21/8238* (2006.01)

(52) U.S. Cl. ............ 438/223; 438/212; 438/224; 438/227; 438/301; 438/306; 257/E21.042; 257/E21.066

(58) Field of Classification Search .......... 257/E21.042, 257/E21.056
See application file for complete search history.

(56) References Cited

U.S. PATENT DOCUMENTS

| 5,963,799 | A   | * | 10/1999 | Wu ........................... 438/199 |
|---|---|---|---|---|
| 6,114,731 | A   |   | 9/2000  | London |
| 6,329,693 | B1  |   | 12/2001 | Kumagai |
| 6,331,787 | B1  |   | 12/2001 | Whitworth et al. |
| 6,365,941 | B1  |   | 4/2002  | Rhee |
| 6,406,954 | B1  | * | 6/2002  | Batra et al. ................. 438/199 |
| 7,019,368 | B1  |   | 3/2006  | McCollum et al. |
| 2002/0074606 | A1 | * | 6/2002 | Mosher ..................... 257/368 |
| 2003/0119269 | A1 | * | 6/2003 | Kim ........................... 438/306 |

* cited by examiner

*Primary Examiner*—Walter L Lindsay, Jr.
*Assistant Examiner*—Mohsen Ahmadi
(74) *Attorney, Agent, or Firm*—Lewis and Roca LLP

(57) ABSTRACT

A transistor formed on a semiconductor substrate of a first conductivity type in a well formed in the substrate and doped with the first conductivity type to an impurity level higher than that of the substrate. A drain doped to a second conductivity type opposite to said first conductivity type is disposed in the well. A pair of opposed source regions doped to the second conductivity type are disposed in the well and are electrically coupled together. They are separated from opposing outer edges of the drain region by channels. A pair of gates are electrically coupled together and disposed above and insulated from the channels. A region of the well disposed below the drain is doped so as to reduce capacitive coupling between the drain and the well.

8 Claims, 7 Drawing Sheets

LOW-CAPACITANCE INPUT/OUTPUT AND ELECTROSTATIC DISCHARGE CIRCUIT FOR PROTECTING AN INTEGRATED CIRCUIT FROM ELECTROSTATIC DISCHARGE

CROSS REFERENCE TO RELATED APPLICATIONS

This application is a divisional of co-pending U.S. patent application Ser. No. 11/282,826, filed Nov. 18, 2005, which is a divisional of U.S. patent application Ser. No. 10/619,172, filed Jul. 11, 2003, now issued as U.S. Pat. No. 7,019,368, which are both hereby incorporated by reference as if set forth herein.

BACKGROUND

1. Field of the Invention

The present invention relates to integrated circuit input/output structures. More specifically, the invention relates to protecting an integrated circuit from electrostatic discharge using a low-capacitance input/output and electrostatic discharge circuit.

2. Background

Integrated circuits are well known in the art. An integrated circuit should be handled with care. As for any complementary Metal Oxide Semiconductor (CMOS) integrated circuits, they can be damaged by Electrostatic Discharge (ESD). The gate oxide part of the CMOS chip may be very thin and can be damaged by electrostatic discharge (voltage established by "static" electricity between the gate oxide and the drain or source inside the integrated circuit). An electrostatic discharge (ESD) in an integrated circuit may result from static electricity build-up caused in the handling of a device, for example friction of the device against packaging material or from static electricity build-up on a person who is not properly grounded or protected against static build-up.

An electrostatic discharge through an integrated circuit can cause a relatively high current to flow through the device. If the current flows through a small feature of the device, the resulting heat could cause the feature to melt, explode, or otherwise fail or be damaged. An integrated circuit designer when designing a chip should take into account all possible ESD current paths within the device and provide alternative paths that will allow current to flow without damaging a feature of the device. An effective discharge path will have a relatively large structure that will not be damaged by the discharged current and a relatively low resistance so that current will easily flow along the designated path.

A traditional structure that is well suited for handling ESD currents is a transistor used in an input/output circuit for an integrated circuit that contains a doped well under all components of the transistor. FIG. 1 is a simple diagram illustrating the structure of transistor 100. As shown in FIG. 1, the source and drain regions are N+ structures 102, while the doped well 104 is a P well. This structure is well suited to ESD currents because of the large size of the transistor 100 and the large area of the junction between the center N+ region 102 and P-well 104 regions. This large junction area, however, leads to a large capacitance, which slows down the performance of the device. As is well known to those of ordinary skill in the art, the higher the doping of the P-well 104, the larger the capacitance of the junction.

Thus, when designing an ESD structure, the designer attempts to isolate all possible discharge currents and direct them through components of the device that will not be damaged by them, e.g., diverting them through the substrate to a ground potential. The use of input/output circuits as ESD protection circuits is known in the art.

FIGS. 2 and 3 illustrate known ESD protection circuits for an integrated circuit device as further described in U.S. Pat. No. 6,365,941 to Rhee. FIG. 2 shows a simplified schematic diagram of a conventional ESD circuit 120. ESD circuit 120 comprises a diode 122 coupled between an input/output pad 124 and grounded semiconductor substrate 126. In this conventional ESD circuit, a P-type anode and an N-type cathode of diode 122 are coupled to grounded semiconductor substrate 126 and input/output (I/O) pad 124, respectively. Also, the I/O pad 124 is coupled to an internal circuit 128 such as an FPGA or other integrated circuit. In this case, a reverse breakdown voltage of the diode 122 must be higher than an operating voltage of internal circuit 128. Therefore, if a voltage lower that the operating voltage of internal circuit 128 and higher than a ground voltage is applied to pad 124, the internal circuit operates normally. If, however, a voltage higher than the operating voltage of internal circuit 128 or a negative voltage is applied to pad 124, it is by-passed through diode 122. Accordingly, internal circuit 128 is protected from excessive currents.

FIG. 3 is a vertical sectional view of a structure in which the ESD circuit 120 in FIG. 2 is implemented in a semiconductor substrate. Referring to FIG. 3, field isolation regions 152 defining active areas are formed in a semiconductor substrate 154. In one example, a P-type semiconductor substrate 154 is employed and N-type impurity region is formed in one of the active areas between isolation regions 152. The N-type impurity region consists of a heavily doped N-type impurity region 158 surrounded by a lightly doped impurity region 156. The N-type impurity region 156 is formed in the same process step as the source-drain regions of high voltage NMOS transistors. In addition, an impurity region doped with impurities of the same conductivity as that of the semiconductor substrate 154 (a P-type impurity region 160) is formed in an active area adjacent to the N-type impurity region. The P-type impurity region 160 serves as a pick-up area for applying bias voltage, i.e., a ground potential, to the semiconductor substrate 154. The isolation layers 152 and the active regions are covered by an interlayer dielectric film. The heavily doped N-type impurity region 156 is connected to I/O pad electrode 162 passing through a predetermined area of the interlayer dielectric film 164. Thus, the N-type impurity region 156 and the semiconductor substrate 154 respectively form an N-type cathode and a P-type anode of the diode 122 shown in FIG. 2.

The characteristics of the ESD circuit of FIG. 2 are directly affected by the junction area of the diode 122. As the area where the N-type impurity region 158 and the semiconductor substrate 154 contact each other is increased, the electrostatic discharge characteristics, the ESD voltage the device is capable of withstanding, increase. However, the integration density of a semiconductor device employing these ESD structures is relatively reduced.

Therefore, in a conventional ESD circuit of a semiconductor device, it is desired to improve the electrostatic discharge characteristics of the ESD circuit without rendering the integration density of the semiconductor device reduced.

FIGS. 4 and 5 illustrate another known signal input/ESD protection circuit. As illustrated in FIG. 4, ESD protection circuit 200 comprises a transistor 202 and a Zener diode 204 rather than a simple junction diode to protect internal circuit 206 against ESD circuits. In this prior art embodiment, the transistor is not activated unless the voltage on pad 208 exceeds the internal circuit's operation voltage, in which case the transistor is activated and the current is discharged to ground, through transistor 202 and the Zener diode 204. FIG. 5 shows a vertical sectional view 250 of the ESD protection circuit 200 shown schematically in FIG. 4.

Hence, what is needed is an improved transistor junction structure for use in an integrated circuit I/O structure. An I/O structure receives signals from an external circuit and inputs them into an internal circuit of the device, or receives signals form the device and outputs them to an external circuit. There is also a need for an I/O structure that can also serve as the electrostatic discharge protection circuit. Alternatively, a separate electrostatic discharge protection circuit may be used.

SUMMARY

A transistor device for an integrated circuit is disclosed having a source, a drain and a gate. The transistor device also comprises a p-substrate level and a p-well having a first and second side layered on a first portion of the p-substrate. The transistor device has a first n+ region layered on a second portion of the p-substrate and between the first and second sides of the p-well. The N+ region is coupled to the drain of the transistor and has a second and third N+ region layered on the P-well coupled to the source and the gate.

A method for forming a transistor is also disclosed. The method comprises forming an n-well in a p-type substrate, with a portion of the n-well being more lightly doped than the remainder of the n-well. The method also comprises forming a P+ drain region disposed in the lightly-doped region of the n-well, with a periphery of the P+ drain region extending beyond an outer boundary of the lightly-doped region of the n-well, and the periphery surrounded by a lightly-doped P region. The method also includes forming a pair of P+ source regions spaced apart from opposite edges of the P+ drain region at a distance sufficient to form first and second channels, with each of the P+ source regions surrounded by a lightly doped P region and electrically coupled together. The method further includes forming a first gate disposed above and insulated from the first channel and a second gate disposed above and insulated from the second channel and electrically coupled to the first gate.

A better understanding of the features and advantages of the present invention will be obtained by reference to the following detailed description of the invention and accompanying drawings, which set forth an illustrative embodiment in which the principles of the invention are utilized.

DETAILED DESCRIPTION OF THE DRAWINGS

Those of ordinary skill in the art will realize that the following description of the present invention is illustrative only and not in any way limiting. Other embodiments of the invention will readily suggest themselves to such skilled persons.

Figure 1:
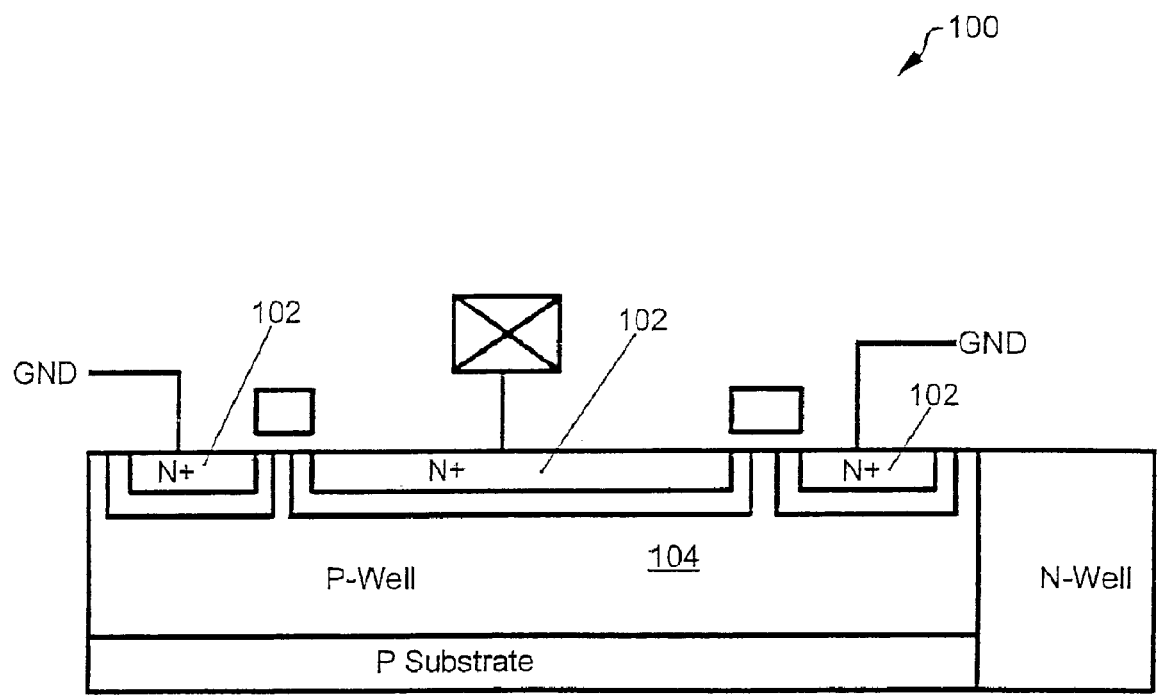
FIG. 1 is a simplified schematic diagram of a known ESD protection device.
Figure 2:
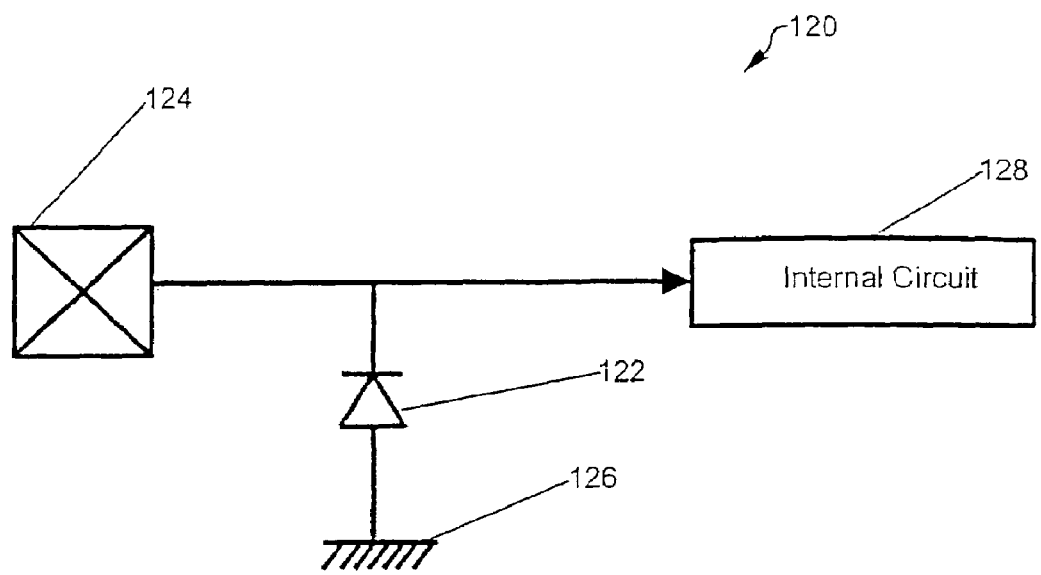
FIG. 2 is a simplified schematic diagram of another known ESD protection device.
Figure 3:
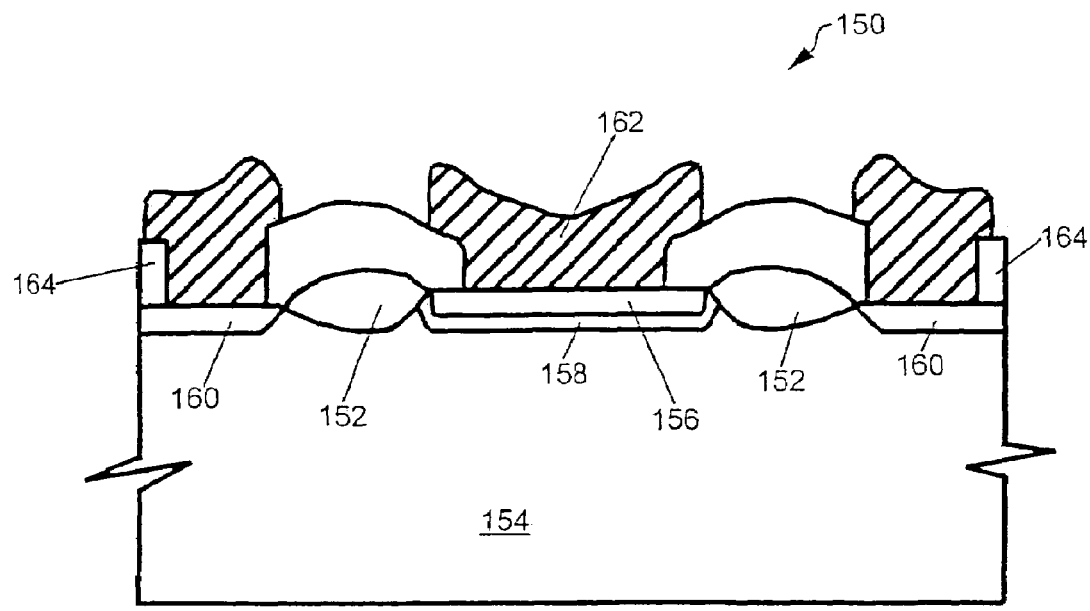
FIG. 3 is a cross-sectional view of the known ESD protection device of FIG. 2.
Figure 4:
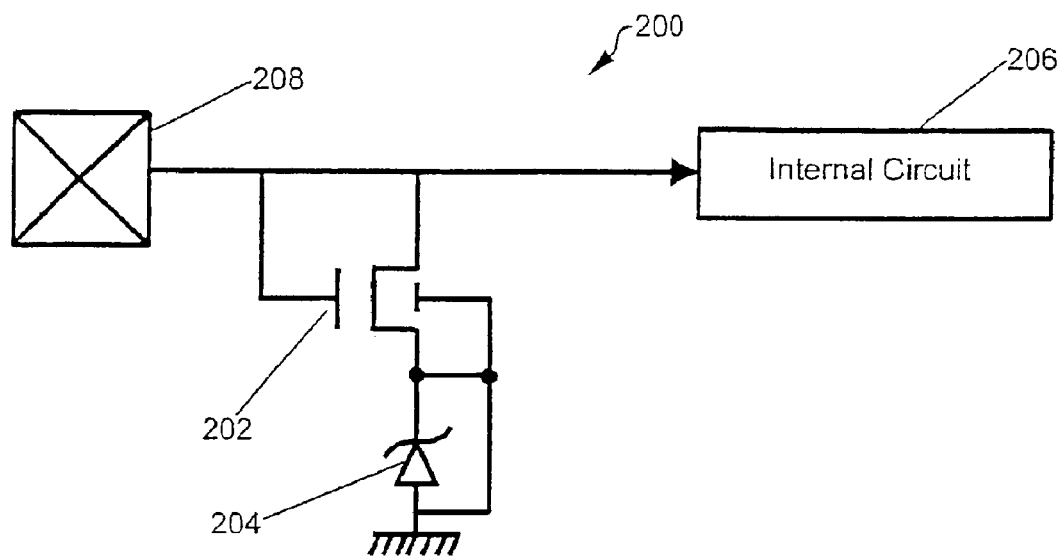
FIG. 4 is a simplified schematic diagram of another known ESD protection device.
Figure 5:
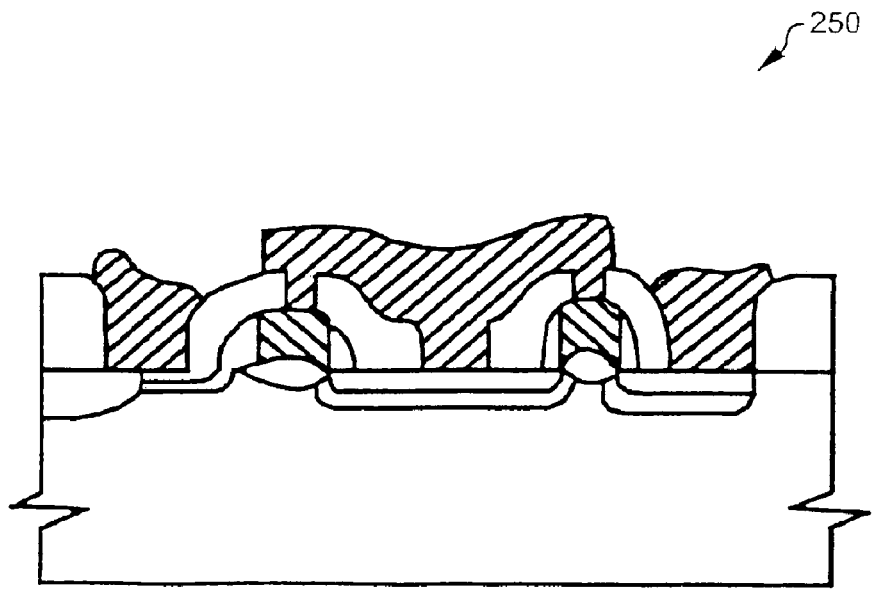
FIG. 5 is a cross-sectional view of the known ESD protection device of FIG. 4.
Figure 6:
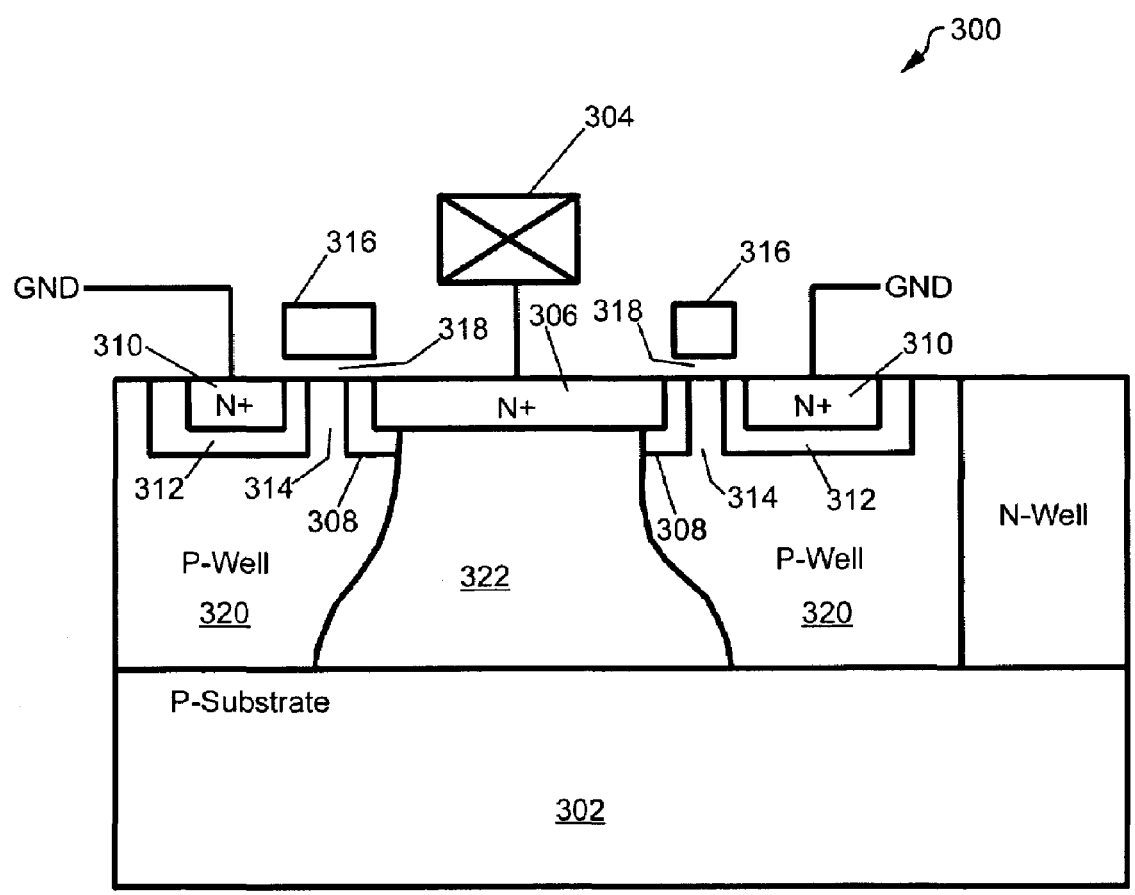
FIG. 6 is a vertical cross-sectional view of a transistor device according to an embodiment of the present invention.

FIG. 6 is a cross-sectional view of an n-channel MOS transistor device 300 according to an embodiment of the present invention. Transistor device 300 is formed on p-type semiconductor substrate 302 and is coupled to an I/O pad 304. A drain for the transistor 300 is formed from a heavily-doped n-type region 306 surrounded by a more lightly-doped n-type region 308. A source for transistor 300 includes two heavily-doped n-type regions 310, electrically connected together and surrounded by a more lightly-doped n-type region 312. The two heavily doped n-type regions 310 and lightly doped regions 312 are spaced apart from opposing edges of the drain to provide channel regions 314. A gate for the transistor 300 is formed by two regions of polysilicon 316 one disposed over and insulated from each of channel regions 314 by a gate dielectric layer 318. Polysilicon regions 316 are electrically connected together.

In transistor device 300, P-well regions 320 are more heavily doped than substrate 302 (i.e., in one embodiment, substrate 302 is boron doped to about 10e15 and p-well 320 is doped to about 10e18) and are disposed under the sources and channel regions 314 of transistor 300. P-well regions 320 do not exist under the drain region of transistor 300 and extends only slightly under the opposing edges of n-type regions 310 and 312 comprising the drain of transistor 300. The region 322 disposed under the drain of transistor 300 and directly in contact with n-type region 306 is doped p-type to the same concentration as the substrate 302. This serves to reduce the capacitance of the device because the junction formed by n-type region 306 and a more lightly-doped P region 322 has a lower capacitance than would be the case if the more heavily-doped p-well 320 existed under the drain of transistor 300. The presence of P-well 320 in the channel region prevents voltage punch through as is well known to those of ordinary skill in the art. However as will be appreciated by persons of ordinary skill in the art, punch through is not a potential problem under the drain junction and P-well 320 does not need to be present in this region.

The formula for simple plate capacitance is given below:

$$C = \frac{\varepsilon A}{d} \quad [\text{Eq. 1}]$$

where $\varepsilon$ is the dielectric constant, A is the area of the plates, and d is the distance between the capacitor plates, i.e., the space charge regions between the N+ region 306 and the p-well 320. As shown from equation 1, as the distance between the plates increases, the capacitance decreases. Also, as the area of the plates decreases the capacitance decreases. As may be seen from in FIG. 6, the depth of the space charge region is greatly increased by the presence of region 322, so the capacitance of the device is greatly reduced. As will be appreciated by persons of ordinary skill in the art, as the size of the interface between the heavily-doped n-type material and the p-well regions increase, the ability of the structure to handle ESD currents decreases because of the low doping level of the substrate and region 322. Therefore a tradeoff exists between the capacitance of the structure and its ability to handle ESD currents. This tradeoff can be balanced by tailoring the overlap of the edges of the p-well 320 with the drain of transistor 300. In the present embodiment, P-well region 320 is tailored so that it overlaps N+ material in the drain as little as possible so as to reduce the device capacitance, but enough so that it also meets the requirements for handling ESD currents. As an example, in an embodiment fabricated using a 0.15 micron process, the overlap may be about 0.3 micron and may generally be about equal to the channel length of the transistor.

Figure 7:
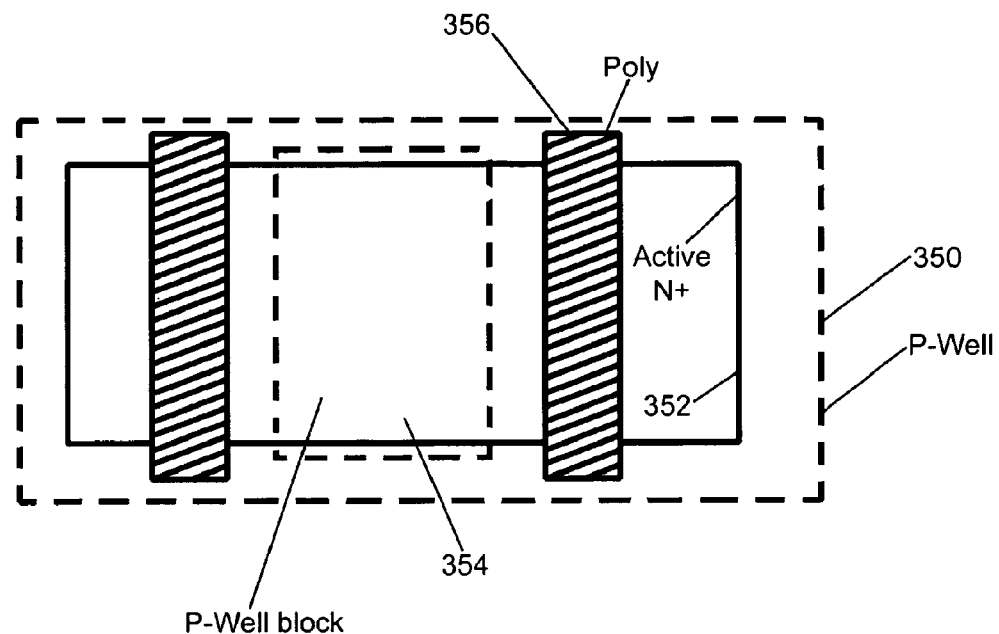
FIG. 7 shows a top view of one embodiment of the transistor device of the present invention.

FIG. 7 shows a top view of one embodiment of the transistor of the present invention. The tailoring of P-well (shown at dashed lines 350) to only slightly overlap N+ material 352 may be accomplished, for example, by adding a blocking region (shown at dashed lines 354) to the P-well implant mask. The P-well implant mask allows p material to be implanted through certain regions of the mask to create P-wells in the P-substrate. The blocking region 354 is a region of mask material found within the aperture used for creating P-well 350, and prevents the implantation of p-type material below the area covered by the blocking material.

Figure 8:
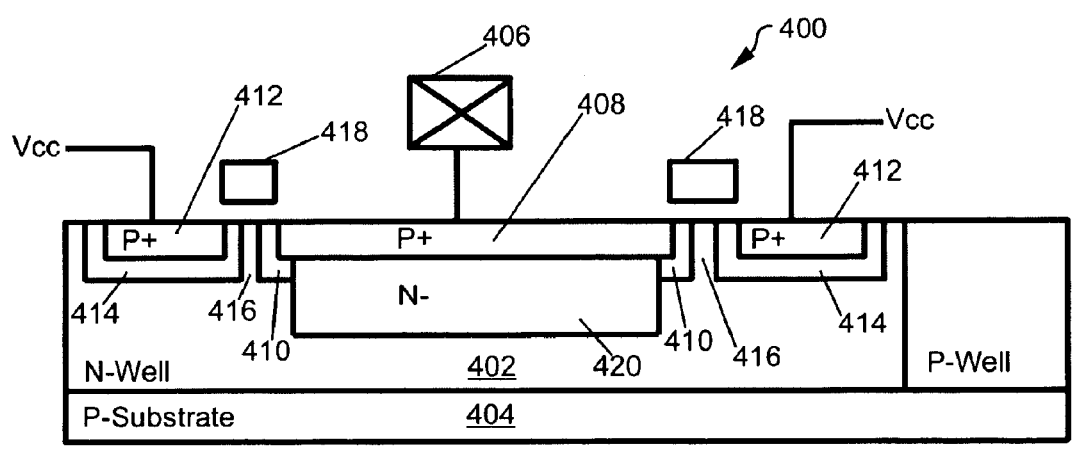
FIG. 8 is a simplified diagram of another embodiment of a reduced-capacitance transistor device.

FIG. 8 is a simplified diagram of another embodiment of a reduced-capacitance transistor device 400. In this embodiment, p-channel MOS transistor device 400 is formed in a n-well 402 disposed in p-type substrate 404 and is coupled to an I/O pad 406. A drain for the transistor 400 is formed from a heavily-doped p-type region 408 surrounded by a more lightly-doped p-type region 410. A source for transistor 400 includes two heavily-doped p-type regions 412, electrically connected together and surrounded by a more lightly-doped p-type region 414. The two heavily doped p-type regions 412 and lightly doped regions 414 are spaced apart from opposing edges of the drain to provide channel regions 416. A gate for the transistor 400 is formed by two regions of polysilicon 418 one disposed over and insulated from each of channel regions 416 by a gate dielectric layer 418. Polysilicon regions 416 are electrically connected together.

A region 420 of the N-well 402 under the drain junction is counter-doped with a P-material such as boron in an amount chosen to reduce the effective net concentration of N dopant in the counter-doped region. Region 420 is thus effectively lightly N-doped directly below the drain junction. This effectively decreases the distance between the P drain junction and the N-well in a manner similar to that of the embodiment of FIG. 6, thereby reducing the capacitance of the device.

Figure 9:
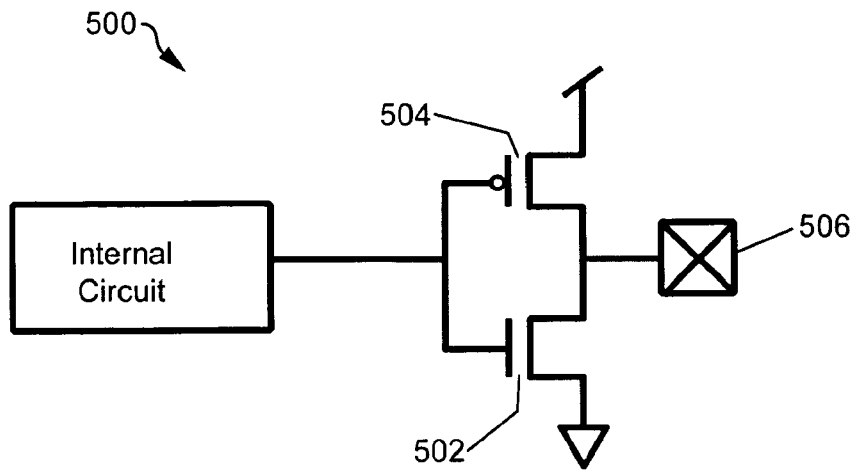
FIG. 9 is a simplified circuit diagram of a circuit that may be used as an I/O and ESD management circuit employing transistors as described above in FIGS. 6 and 8.

FIG. 9 is a simplified circuit diagram of an I/O and ESD management circuit 500 employing the transistors as described above in FIGS. 6 and 8. Circuit 500 comprises an inverter formed from an n-channel MOS pulldown transistor 502 (like the one shown in FIG. 6) in series with a p-channel MOS pullup transistor 504 (like the one shown in FIG. 8). N-channel MOS pulldown transistor 502 has its source coupled to ground and p-channel MOS pullup transistor 504 has its source coupled to Vcc. I/O pad 506 is coupled to node 504 at the common drain connections of transistors 502 and 504. The gates of transistors 502 and 504 are connected together. Circuit 500 may act as both an ESD-protection device and a switch.

Figure 10:
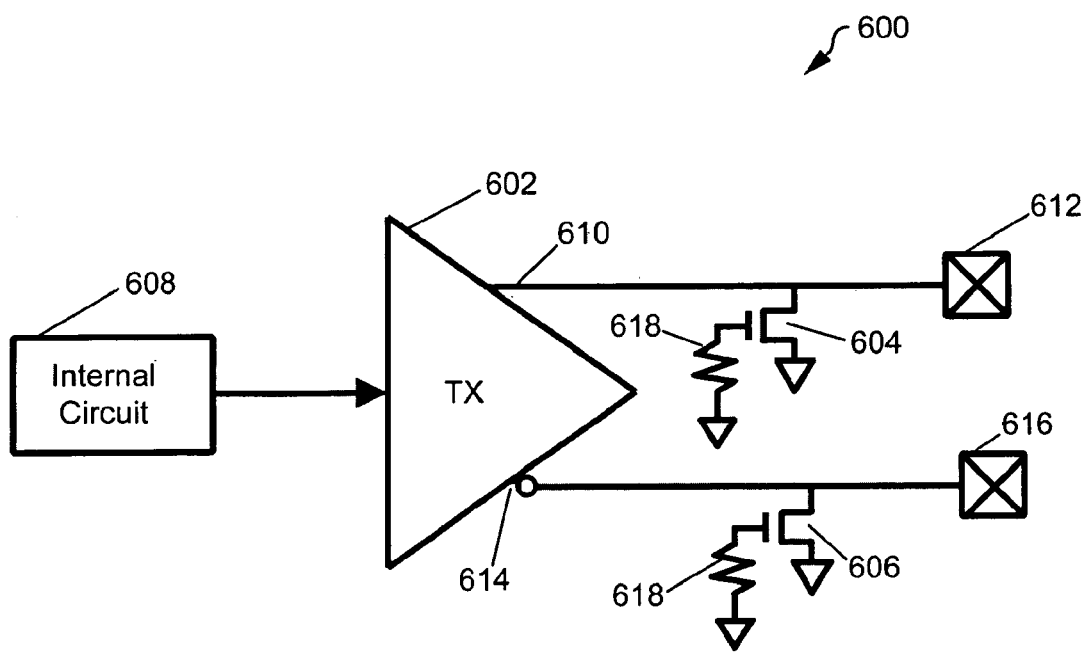
FIG. 10 is a simplified circuit diagram of another circuit that may be used as an I/O and ESD management circuit employing transistors as described above in FIGS. 6 and 8.

FIG. 10 is a simplified circuit diagram of another circuit 600 that may be used as an I/O and ESD management circuit employing the transistors as described above in FIGS. 6 and 8. Circuit 600 comprises a differential transmitter 602 and transistors 604 and 606. Differential transmitter 602 is driven from an internal circuit 608. The non-inverting output 610 of differential transmitter 602 is coupled to I/O pad 612 and the inverting output 614 of differential transmitter 602 is coupled to I/O pad 616. The drain of transistor 602 is coupled to the non-inverting output 610 of differential transmitter 602 and the drain of transistor 604 is coupled to the inverting output 614 of differential transmitter 602. The sources of both transistors 604 and 606 are coupled to ground. The gates of both transistors 604 and 606 are coupled to ground through impedance-matching resistors 618 having resistance values selected to match the impedance of the transmission line that will be connected to I/O pads 612 and 616. Transistors 604 and 606 are of the type shown in FIG. 6 and act as ESD-protection devices to protect the internal circuit from any current that is higher that needed for circuit operation and which may damage the internal circuit. Transistors 606 are illustrated in detail in FIG. 6.

Figure 11:
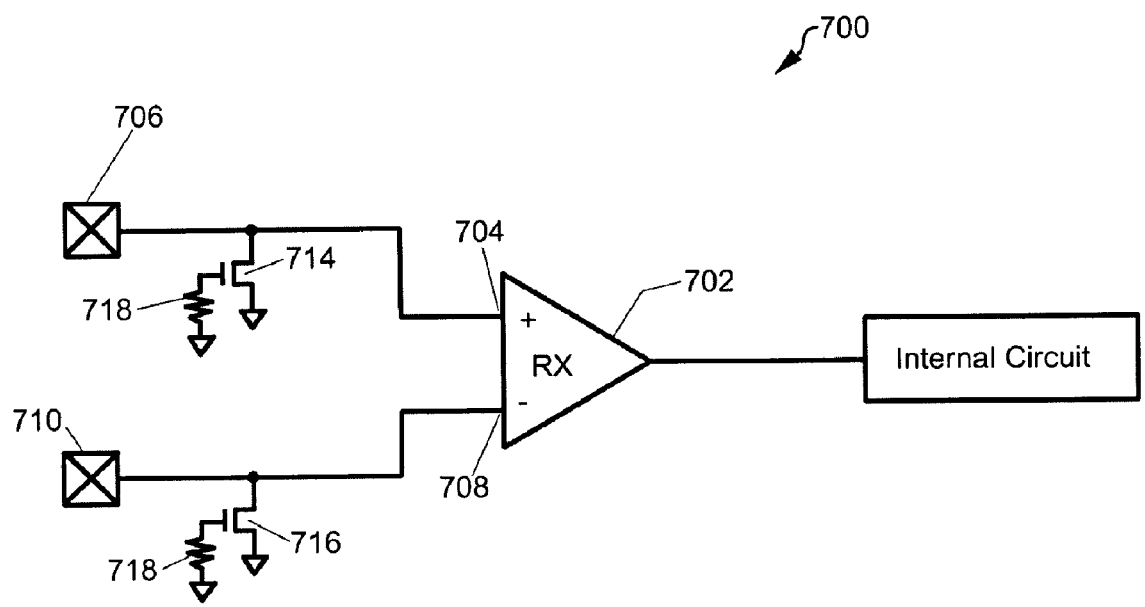
FIG. 11 is a simplified circuit diagram of yet another circuit that may be used as an I/O and ESD management circuit employing transistors as described above in FIGS. 6 and 8.

FIG. 11 is a simplified circuit diagram of yet another circuit 700 that may be used as an I/O and ESD management circuit employing the transistors as described above in FIGS. 6 and 8. Circuit 700 comprises a differential receiver 702 having a non-inverting input 704 coupled to I/O pad 706 and an inverting input 708 coupled to I/O pad 710. The output of differential receiver 702 is coupled to an internal circuit 712. Transistors 714 and 716 have their drains coupled, respectively, to I/O pad 706 and I/O pad 710. The sources of both transistors 714 and 716 are coupled to ground. The gates of both transistors 714 and 716 are coupled to ground through impedance-matching resistors 718 having resistance values selected to match the impedance of the transmission line that will be connected to I/O pads 706 and 710. Transistors 714 and 716 act as ESD devices to protect the internal circuit from any current that is higher that needed for circuit operation and which may damage the internal circuit.

It should be understood that various alternatives to the embodiments of the disclosed method and apparatus described herein maybe employed in practicing the disclosed method and using the disclosed apparatus. It is intended that the following claims define the scope of the disclosed method and apparatus and that methods and structures within the scope of these claims and their equivalents be covered thereby.

What is claimed is:

1. A method for forming a transistor comprising:
   forming an n-well in a p-type substrate, the n-well including a selected central region having an effective net concentration of n-type dopant less than the concentration of n-type dopant in the remainder of the n-well;
   forming a p-type drain region in the selected central region of the n-well, the p-type drain region being more heavily doped at a center portion thereof and more lightly doped at a peripheral region thereof;
   forming first and second p-type source regions spaced apart from opposite edges of the p-type drain region at distances sufficient to form a first channel between the p-type drain region and the first p-type source region and a second channel between the p-type drain region and the second p-type source region, each of the first and second p-type source regions being more heavily doped at a center portion thereof and more lightly doped at a peripheral region thereof, and further being electrically connected to one another; and forming a first gate disposed above and insulated from the first channel and a second gate disposed above and insulated from the second channel, the first and second gates electrically coupled to one another.

2. The method of claim 1 wherein forming the n-well including a selected central region having an effective net concentration of n-type dopant than in the remainder of the n-well comprises:

forming the n-well with a first concentration of n-type dopant; and counterdoping the n-well with a p-type dopant in the selected central region in an amount chosen to reduce the effective net concentration of n-type dopant in the selected region.

3. The method of claim 1, wherein forming the p-type drain region includes forming the p-type drain to extend laterally into the n-well beyond an outer boundary of the selected central region of the n-well.

4. The method of claim 3 wherein forming the p-type drain to extend laterally into the n-well beyond the outer boundary of the selected central region of the n-well includes forming the p-type drain to extend beyond the outer boundary of the selected central region of the n-well by a distance substantially equal to the channel length of the transistor.

5. A method for forming a transistor comprising:

forming a p-well in a p-type substrate, the p-well including a selected central region having an effective net concentration of p-type dopant less than the concentration of p-type dopant than in the remainder of the p-well;

forming an n-type drain region in the selected central region of the p-well, the n-type drain region being more heavily doped at a center portion thereof and more lightly doped at a peripheral region thereof;

forming first and second n-type source regions spaced apart from opposite edges of the n-type drain region at distances sufficient to form a first channel between the n-type drain region and the first n-type source region and a second channel between the n-type drain region and the second n-type source region, each of the first and second n-type source regions being more heavily doped at a center portion thereof and more lightly doped at a peripheral region thereof, and further being electrically connected to one another; and forming a first gate disposed above and insulated from the first channel and a second gate disposed above and insulated from the second channel, the first and second gates electrically coupled to one another.

6. The method of claim 5 wherein forming the p-well including a selected central region having an effective net concentration of p-type dopant than in the remainder of the n-well comprises:

forming the p-well with a first concentration of n-type dopant; and counterdoping the p-well with a n-type dopant in the selected central region in an amount chosen to reduce the effective net concentration of p-type dopant in the selected region.

7. The method of claim 5, wherein forming the n-type drain region includes forming the n-type drain to extend laterally into the p-well beyond an outer boundary of the selected central region of the p-well.

8. The method of claim 7 wherein forming the n-type drain to extend laterally into the p-well beyond the outer boundary of the selected central region of the p-well includes forming the n-type drain to extend beyond the outer boundary of the selected central region of the p-well by a distance substantially equal to the channel length of the transistor.

* * * * *